United States Patent
Cho et al.

(10) Patent No.: US 6,528,888 B2
(45) Date of Patent: Mar. 4, 2003

(54) INTEGRATED CIRCUIT AND METHOD

(75) Inventors: Chih-Chen Cho, Richardson, TX (US); Jeffrey A. McKee, Grapevine, TX (US); William R. McKee, Plano, TX (US); Isamu Asano, Iruma (JP); Robert Y. Tsu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/776,212

(22) Filed: Feb. 2, 2001

(65) Prior Publication Data

US 2001/0005058 A1 Jun. 28, 2001

Related U.S. Application Data

(63) Continuation of application No. 08/970,222, filed on Nov. 14, 1997, now abandoned.

(51) Int. Cl.[7] .............................................. H01L 23/48
(52) U.S. Cl. ...................... 257/775; 257/306; 257/750; 257/773
(58) Field of Search ................................ 257/306, 750, 257/756, 773, 775; 438/253, 618, 658

(56) References Cited

U.S. PATENT DOCUMENTS

| | | | | |
|---|---|---|---|---|
| 5,079,181 A | * | 1/1992 | Shimizu et al. | 438/252 |
| 5,094,965 A | * | 3/1992 | Ozaki et al. | 438/294 |
| 5,286,998 A | * | 2/1994 | Ema | 257/637 |
| 5,420,462 A | * | 5/1995 | Sudo | 257/775 |
| 5,538,912 A | * | 7/1996 | Kunori et al. | 438/201 |
| 5,561,623 A | * | 10/1996 | Ema | 365/51 |
| 5,604,145 A | * | 2/1997 | Hashizume et al. | 438/240 |
| 5,631,182 A | * | 5/1997 | Suwanai et al. | 438/241 |
| 5,804,479 A | * | 9/1998 | Aoki et al. | 438/253 |
| 5,811,849 A | * | 9/1998 | Matsuura | 257/306 |
| 6,168,985 B1 | * | 1/2001 | Asano et al. | 438/241 |

\* cited by examiner

Primary Examiner—Allan R. Wilson
Assistant Examiner—George C. Eckert, II
(74) Attorney, Agent, or Firm—Carlton H. Hoel; W. James Brady; Frederick J. Telecky, Jr.

(57) ABSTRACT

An integrated circuit. The circuit includes a memory cell array including wordlines 201 formed on a substrate and bitlines 200 and capacitors 203 formed over the wordlines. The bitlines have a first thickness and pitch. The circuit also includes circuits peripheral to the array including transistors formed in the substrate and conductors 202 over the transistors. The conductors have a second thickness and pitch. The circuit is further characterized in that the bitlines and conductors are formed in a common conductive layer. In further embodiments, the first thickness and pitch are smaller than the second thickness and pitch.

2 Claims, 15 Drawing Sheets

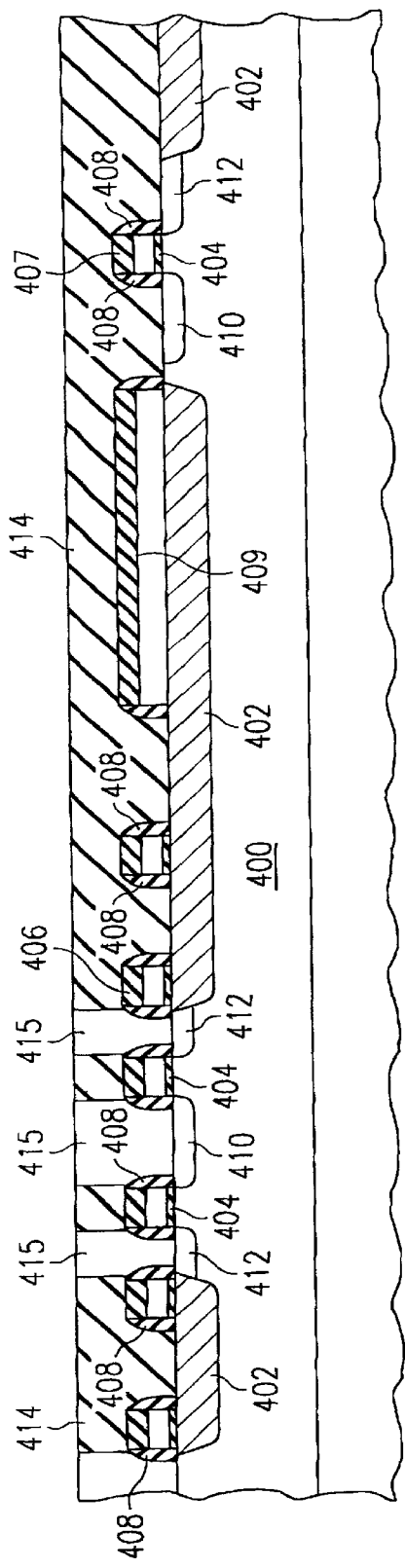
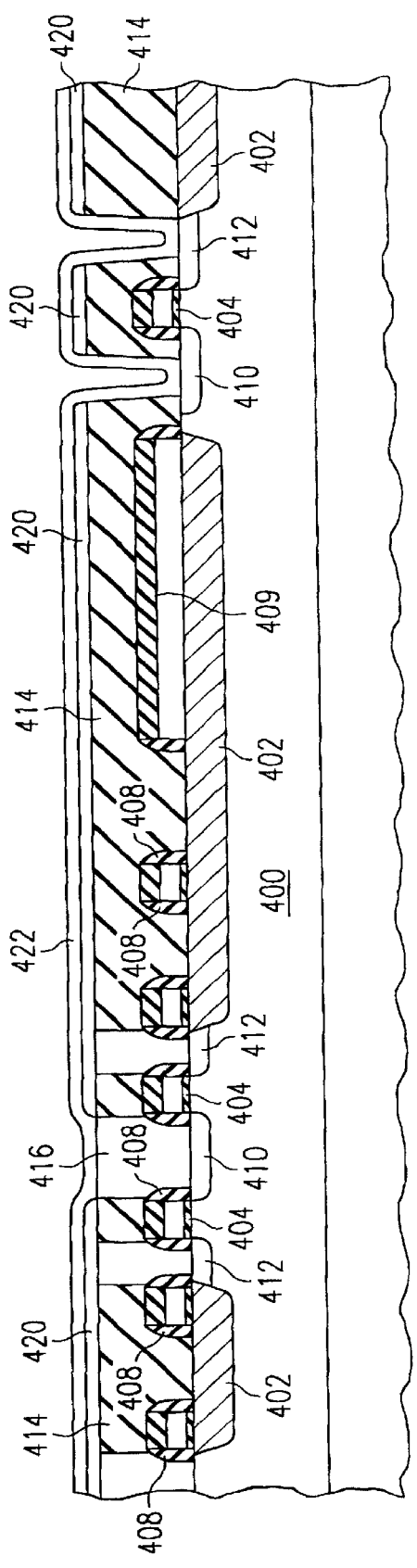
FIG. 4a
FIG. 4b

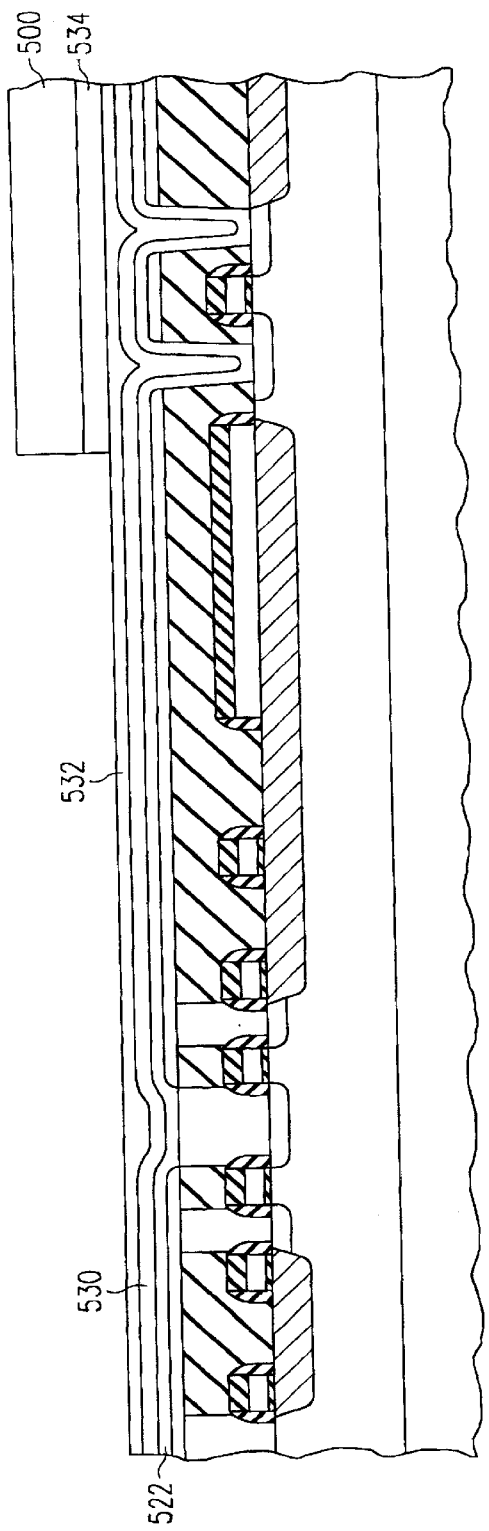
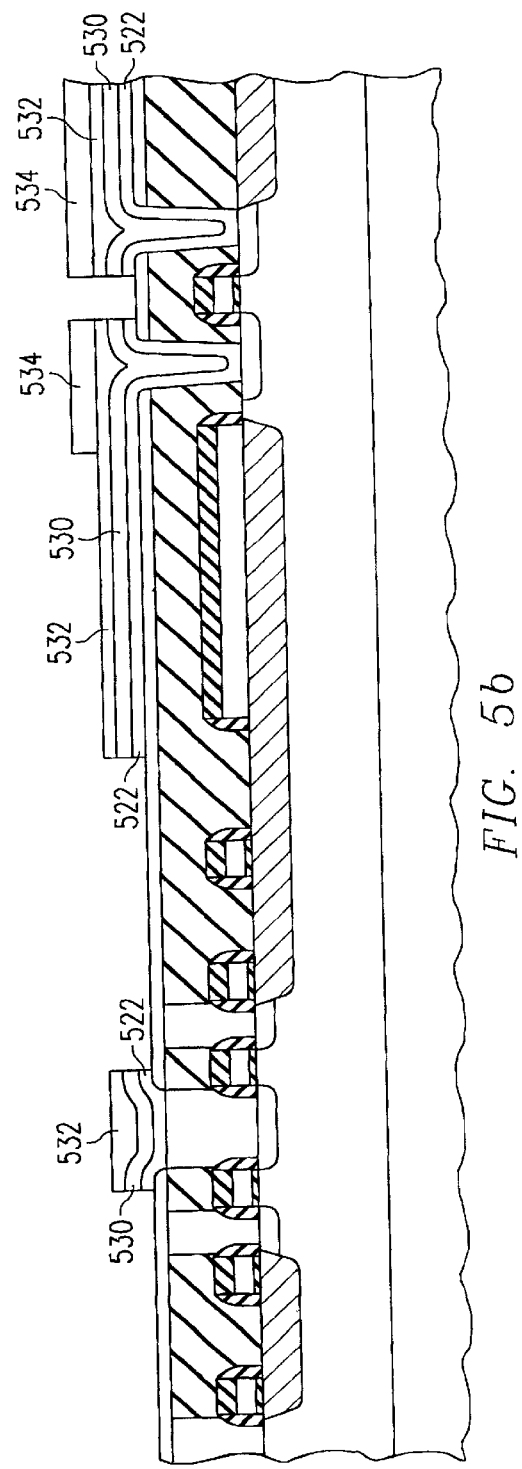
FIG. 5a
FIG. 5b

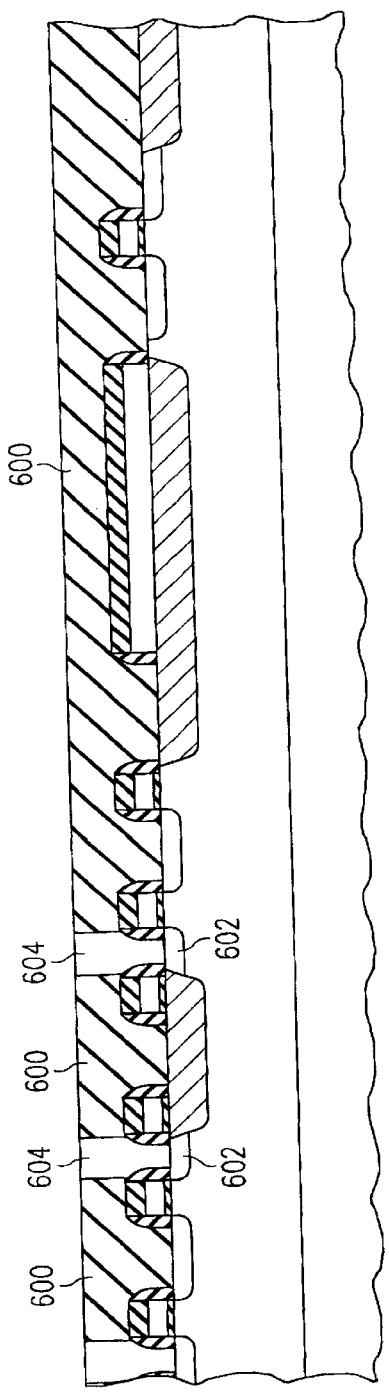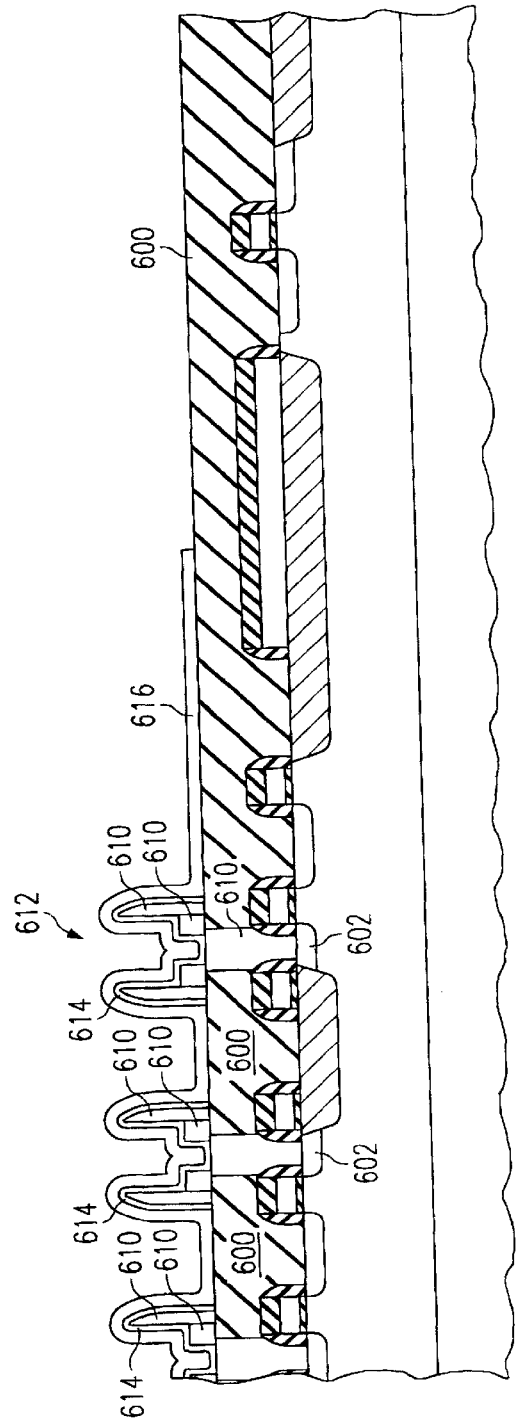

INTEGRATED CIRCUIT AND METHOD

CROSS REFERENCE

This application claims priority under 35 USC §120 and is a continuation of application Ser. No. 08/970,222 filed Nov. 14, 1997 now abandoned.

FIELD OF THE INVENTION

This invention relates to electronic devices, and more specifically to semiconductor memory integrated circuits and methods of fabrication.

BACKGROUND OF THE INVENTION

The density of circuit elements increases as integrated circuits become more complex. In addition, more complex circuits are typically designed to operate at higher frequencies. As a result of the shrinking dimensions and increased speeds, undesirable capacitive coupling between circuit elements becomes a problem that must be addressed. Capacitive coupling is a particular problem in dynamic random access memories (DRAMs) as increasingly large amounts of memory capacity is placed on an integrated circuit. In particular, the bitlines of DRAMs are being placed closer in proximity to one another as the area available on the integrated circuit substrate is used more efficiently. The bitline-to-bitline coupling that results from such close spacing can caused data errors in the memory, and hence is a problem that must be addressed.

As the memory capacity of DRAMs has increased, designers have begun to use the vertical dimension as one approach to putting more capability in a given die space. In particular, the storage capacitors for DRAMs are typically formed away from the substrate surface, and with shapes designed to enhance the area, and hence capacitance, of the structure. A typical capacitor in use is the so-called crown cell. One problem with the vertical nature of these circuits is the large difference in height between the memory cell array and the peripheral circuits. The capacitors in the cell array can extend hundreds of nanometers above the surrounding periphery circuits. This height difference makes the patterning and etching of narrow and closely-spaced lines and vias in both the cell array and the periphery difficult.

SUMMARY OF THE INVENTION

In accordance with a preferred embodiment of the invention, there is disclosed an integrated circuit. The circuit includes a memory cell array, circuits peripheral to the array, and a conductor coupling the array to the peripheral circuits. The conductor has a first thickness in the array and a second thickness in the peripheral circuits.

In accordance with another preferred embodiment of the invention, there is disclosed an integrated circuit. The circuit includes a memory cell array including wordlines formed on a substrate and bitlines and capacitors formed over the wordlines. The bitlines have a first thickness and pitch. The circuit also includes circuits peripheral to the array including transistors formed in the substrate and conductors over the transistors. The conductors have a second thickness and pitch. The circuit is further characterized in that the bitlines and conductors are formed in a common conductive layer. In further embodiments, the first thickness and pitch are smaller than the second thickness and pitch.

An advantage of the inventive concepts is that the bitline and first conductor layers may be formed simultaneously, and yet may be produced in the thicknesses appropriate for use in both the cell array and periphery of a memory integrated circuit. A relatively thin bitline reduces line-to-line coupling, while a relatively thick periphery circuit interconnect provides low resistance. In one embodiment in accordance with the invention, the bitline/first-metal layer compensates for the height difference in the cell array and periphery by being relatively thin the cell array and relatively thick in the periphery.

BRIEF DESCRIPTION OF THE DRAWINGS

The foregoing features of the present invention may be more fully understood from the following detailed description, read in conjunction with the accompanying drawings, wherein:

FIG. 2b is a plan view of the DRAM shown in cross-section in FIG. 2a;

FIG. 3b is a plan view of the DRAM shown in cross-section in FIG. 3a;

FIGS. 4a to 4f are cross-sectional diagrams of an embodiment DRAM at various stages in a first embodiment fabrication process in accordance with the invention;

FIGS. 5a and 5b are cross-sectional diagrams of an embodiment DRAM at various stages in a second embodiment fabrication process in accordance with the invention;

FIGS. 6a to 6e are cross-sectional diagrams of an embodiment DRAM at various stages in a third embodiment fabrication process in accordance with the invention.

DETAILED DESCRIPTION OF PREFERRED EMBODIMENTS

Overview

Figure 1:
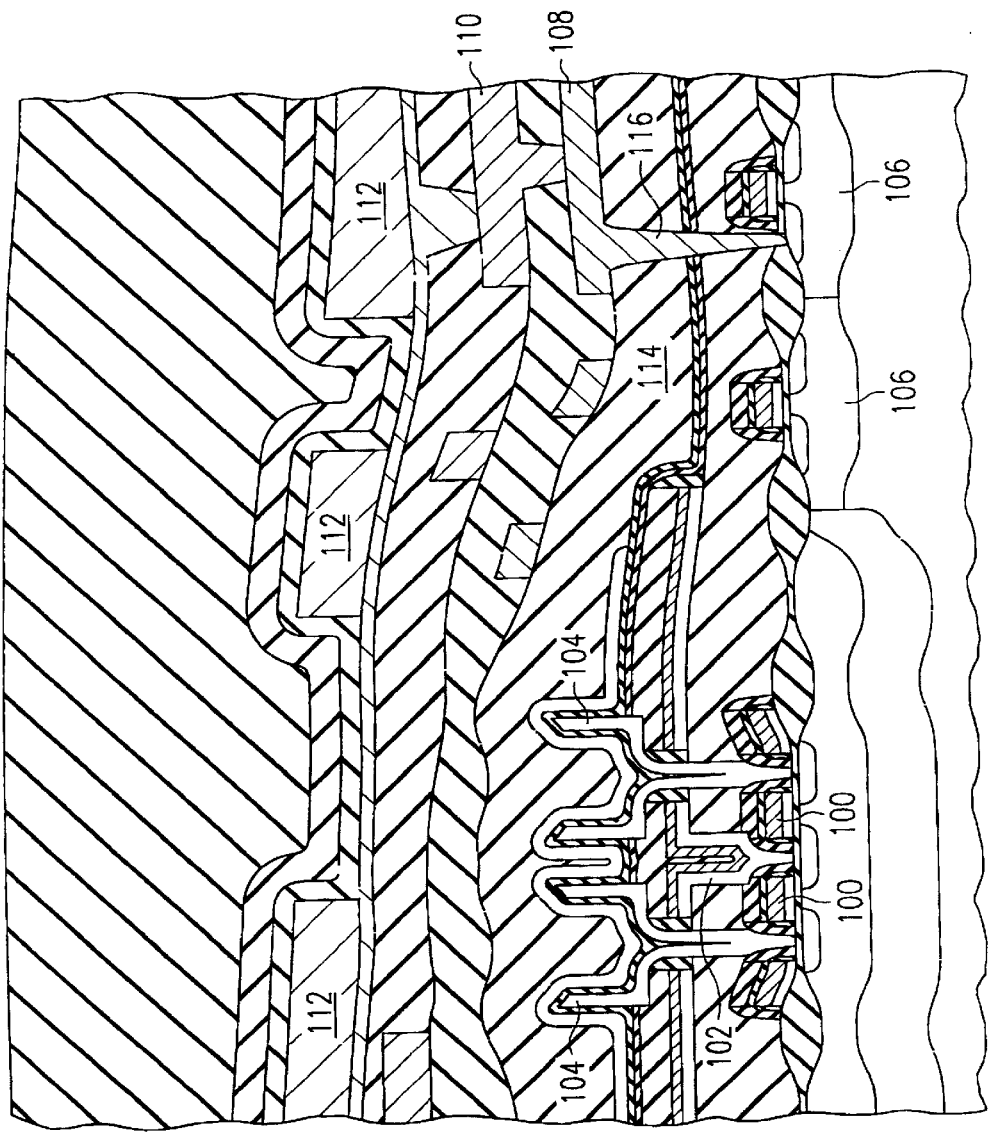
FIG. 1 is a cross-sectional diagram of a capacitor-over-bitline DRAM at the edge of the cell array.

FIG. 1 is a cross-sectional elevation view of a conventional DRAM at the edge of the memory cell array. The memory cell array includes wordlines 100, bitline 102, and storage capacitors 104. Circuits at the periphery of the cell array, sense amplifiers for example, include transistors 106. Connections to the cell array and periphery circuits are made by the first metal layer 108, in addition to second 110 and third metal layers 112. Note the difference in height of the surface of interlayer dielectric 114 over the cell array versus over the periphery circuitry. The height difference can make the photolithographic definition of features such as vias and conductors on subsequent layers difficult. In addition, thick dielectric layers result in via 116 having a large aspect ratio, which makes via formation and filling problematic.

Figure 2A:
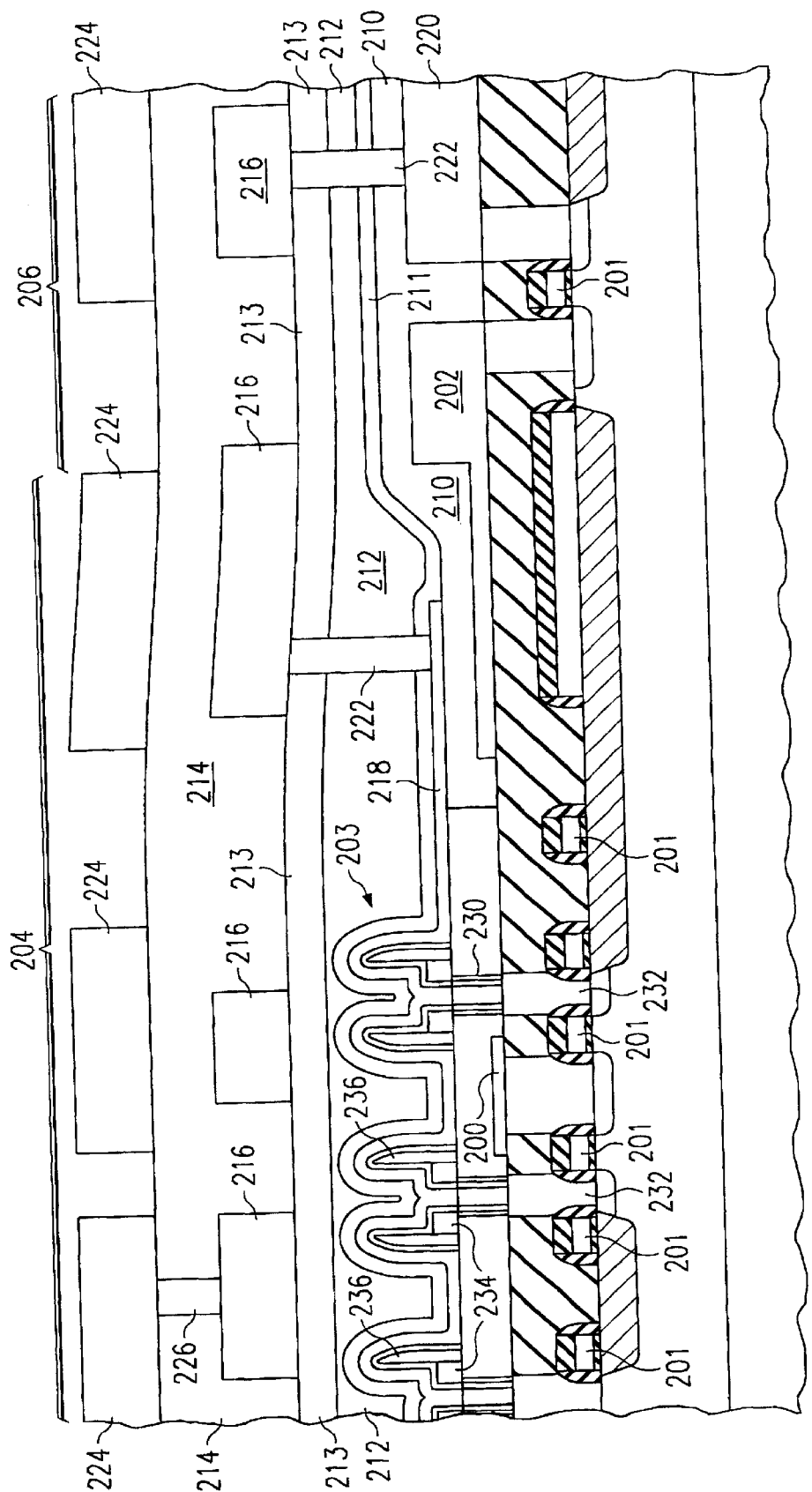
FIG. 2a is a cross-sectional diagram of a capacitor-over-bitline DRAM in accordance with an embodiment of the invention.

FIG. 2a is a cross-sectional elevation view of a first preferred embodiment DRAM at the cell array edge, the DRAM incorporates a capacitor-over-bitline (COB) memory cell. Bitline 200 and first metal layer 202 are formed in a common conductive layer, but the layer over the memory cell array 204 is relatively thin in comparison to the first metal layer formed over the peripheral circuits 206. The common conductive layer is preferably a refractory material such as tungsten or a metal-silicide such as tungsten silicide, since the structure undergoes high temperature process steps in the formation of the storage capacitors 203. Forming the bitline and first metal in a common layer simplifies the process and can potentially eliminate a mask step, resulting in reduced process costs. Specifically, in the DRAM structure shown in FIG. 1, the bitline and first metal patterns are formed in two separate steps in which photolithographic patterning is critical. In the structure of FIG. 2a, on the other hand, the bitline and first metal may be patterned in a single photolithographic step. The patterning used in thinning the portion of the conductive layer over the cell array 204 is a relatively non-critical, and thus cheaper, mask. For example, the mask for thinning the bitline may be a standard binary mask, rather then the more expensive Levinson or half-tone phase shift masks required for small feature lithography. In addition, the thickness difference in the bitline/first metal layer partially compensates for the large height disparity introduced in the structure by storage capacitors 203. This allows subsequently-applied layers to have relatively uniform heights across the circuit, thereby facilitating the formation of lines and vias in the upper interconnect levels of the circuit.

The upper interconnect levels of the DRAM include interlayer dielectric 210, 211, 212, 213, and 214. Second metal layer 216 connects to capacitor field plate 218 and to peripheral interconnects 220 through vias 222. Third metal layer 224 connects to second metal layer 216 through vias 226.

Figure 2B:
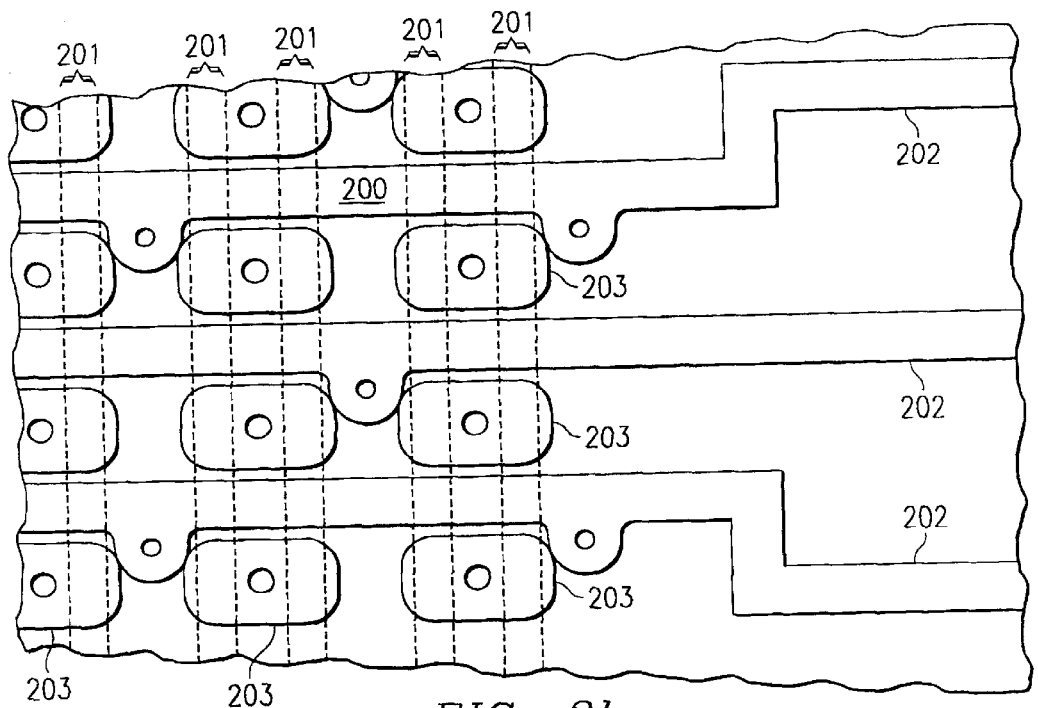

FIG. 2b is a plan view of the COB embodiment showing the relationship of wordlines 201, bitlines 200, storage capacitors 203, and conductors 202 in the peripheral circuits. The upper layers of conductors are not shown in FIG. 2b. Bitlines 200 are typically spaced at a pitch of less than 0.25 $\mu$m, while the conductors 202 in the periphery are typically spaced at a larger pitch, 0.35 $\mu$m for example.

Figure 3B:
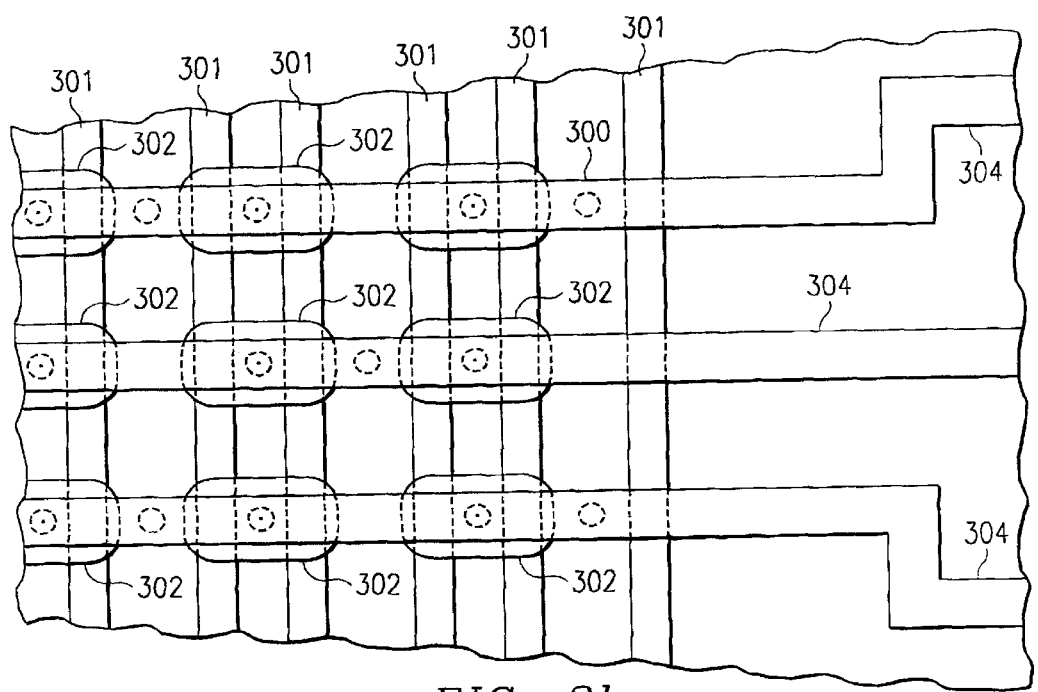
Figure 3A:
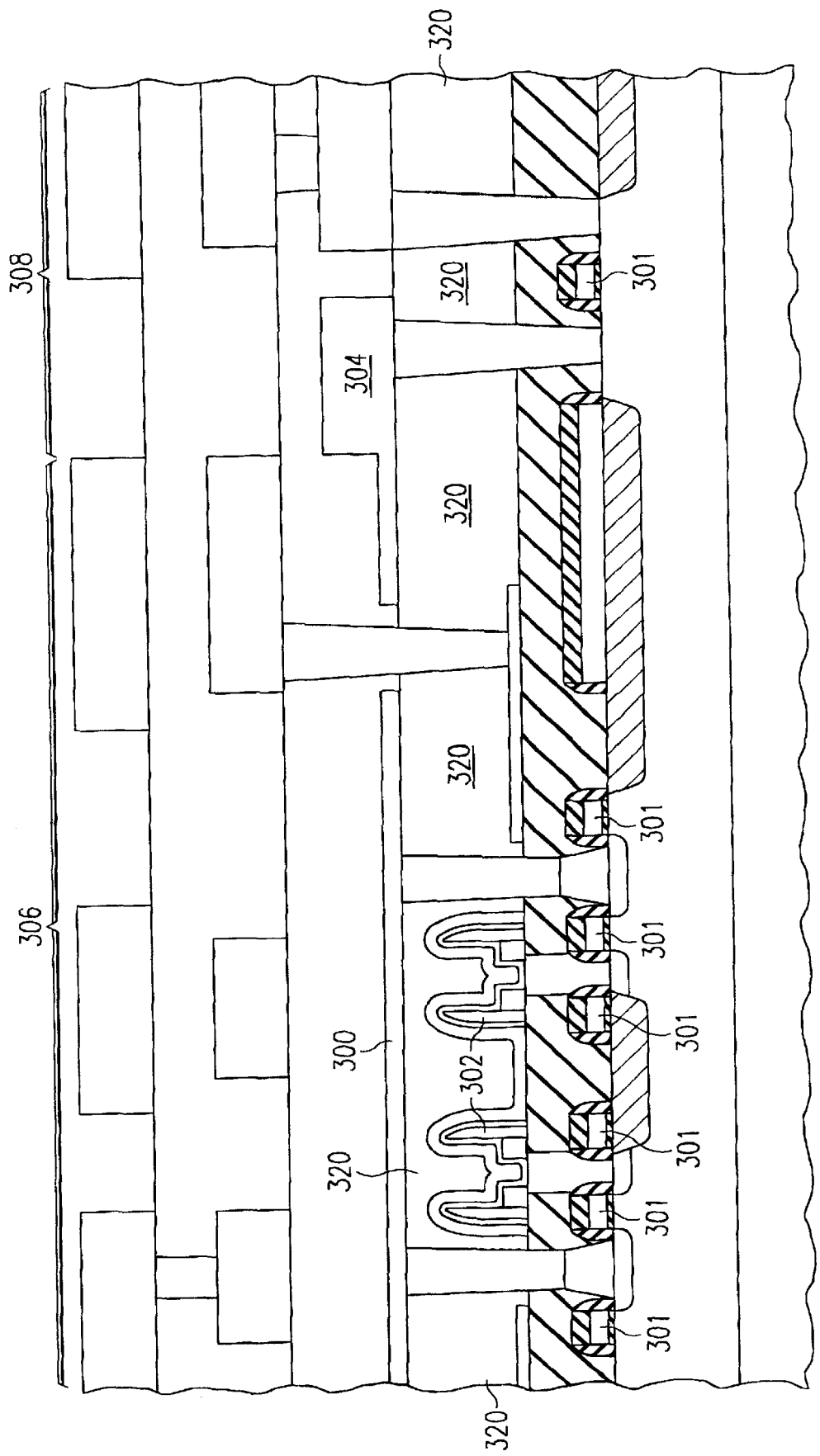
FIG. 3a is a cross-sectional diagram of a bitline-over-capacitor DRAM in accordance with a second preferred embodiment of the invention.

FIG. 3a is a cross-sectional elevation view of a second preferred embodiment DRAM at the cell array edge. The DRAM in FIG. 3a incorporates a (capacitor-under-bitline) CUB memory cell. In this embodiment, bitline 300 is routed over the storage capacitors 302. As in the first preferred embodiment, the bitline 300 and first metal layer 304 are formed in a common layer. The layer is relatively thin in the memory cell array portion 306 of the circuit, and is relatively thick in the peripheral circuit portion 308. Since the common layer occurs higher in the structure in the CUB approach (and hence after high temperature process steps), more conventional materials, such as aluminum, copper, and so forth, are preferred.

FIG. 3b is a plan view of the CUB embodiment showing the relationship of wordlines 301, bitlines 300, storage capacitors 302, and first metal layer conductors 304 in the peripheral circuits. The upper layers of conductors are not shown in FIG. 2b. The conductors 304 in the periphery are typically spaced at about 0.35 $\mu$m as in the first preferred embodiment.

Fabrication

FIGS. 4a–4e illustrate steps of an embodiment fabrication method for a DRAM with a COB cell in cross-sectional elevation view at the memory cell array.

(a) Start with a silicon substrate 400 (or silicon-on-insulator substrate) with shallow trench isolation 402 and twin wells (not shown) for CMOS periphery circuitry and the memory cell array. Perform threshold adjustment implants (which may differ for cell transistors and various peripheral transistors), and form gate dielectric 404. Deposit tungsten-silicide-coated polysilicon gate material and a silicon dioxide layer, then pattern the layers to form oxide-topped gates 406 plus peripheral transistor gates 407, and gate-level interconnects 409. Perform lightly-doped-drain implants, and then form sidewall dielectric 408 on the gates by deposition plus anisotropic etching. Introduce dopants to form sources 410 and drains 412 including peripheral source/drains to complete the transistor level. Cover the structure with a planarized dielectric layer 414, such as borophosphosilicate glass. Photolithographically define and etch holes (vias) in the planarized dielectric down to drains 410 and sources 412. Blanket deposit in-situ p-doped polysilicon and chemically-mechanically polish (CMP) to form stems 415 in the holes. See FIG. 4a.

In another approach (not shown in the figures) to forming polysilicon contact stems 415, an approximately 30 nm oxide layer is deposited over the gates 406. An approximately 700 nm in-situ doped sacrificial poly layer is deposited and subjected to CMP to produce a final thickness of approximately 200 nm covering the cell array and periphery. The poly layer is then removed, with the exception of portions covering the gates 406 in the cell array. BPSG is then deposited and planarized with CMP to a thickness 200 nm. The sacrificial poly is then removed, as is the 30 nm oxide layer. The poly stems 415 are then deposited and etched back, resulting in the structure shown in FIG. 4a.

(b) Deposit approximately 50 nm of cap oxide 420. Pattern oxide 420 with photoresist (not shown) and remove the portion covering the bitline contact 416. Ash the photoresist and pattern oxide 420 with photoresist (not shown) to prepare contacts to periphery source 410 and drain 412. Etch through oxide 420 and dielectric layer 414 to expose the periphery source and drain. Ash the photoresist. Sputter deposit a barrier layer 422 comprising titanium and titanium nitride. Perform rapid thermal annealing at approximately 700° C. to silicide the contacts. See FIG. 4b.

(c) Deposit bitline/first-metal common-layer stack including lower conductor layer 430, etch stop layer 432, and upper conductor layer 434. In this embodiment lower conductor layer 430 comprises an approximately 1 um thick layer of tungsten or other refractory metal. Etch stop layer 432 is a material that exhibits high etch selectivity to the tungsten or other material used for layer 430 and to the material used for upper conductor layer 434. Etch stop layer 432 is preferably titanium nitride having a thickness of approximately 0.5 um in this embodiment. Titanium of a similar thickness may also be used. Upper conductor layer 434 is preferably a tungsten layer (or other refractory metal) having thickness on the order of 3 um. See FIG. 4c.

Figure 4C:
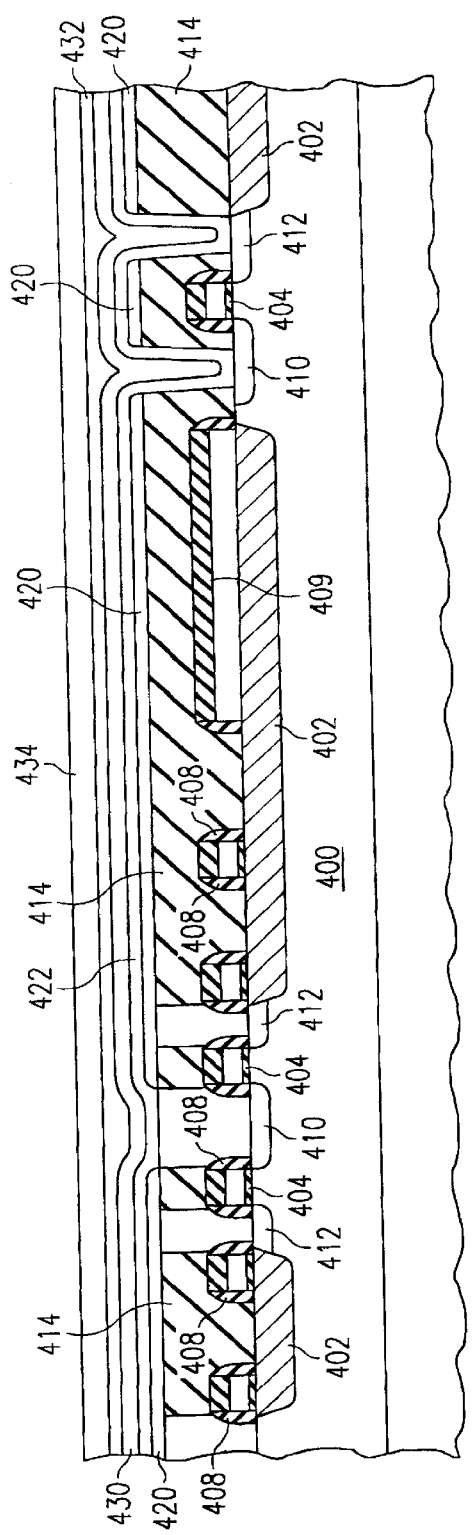
Figure 4D:
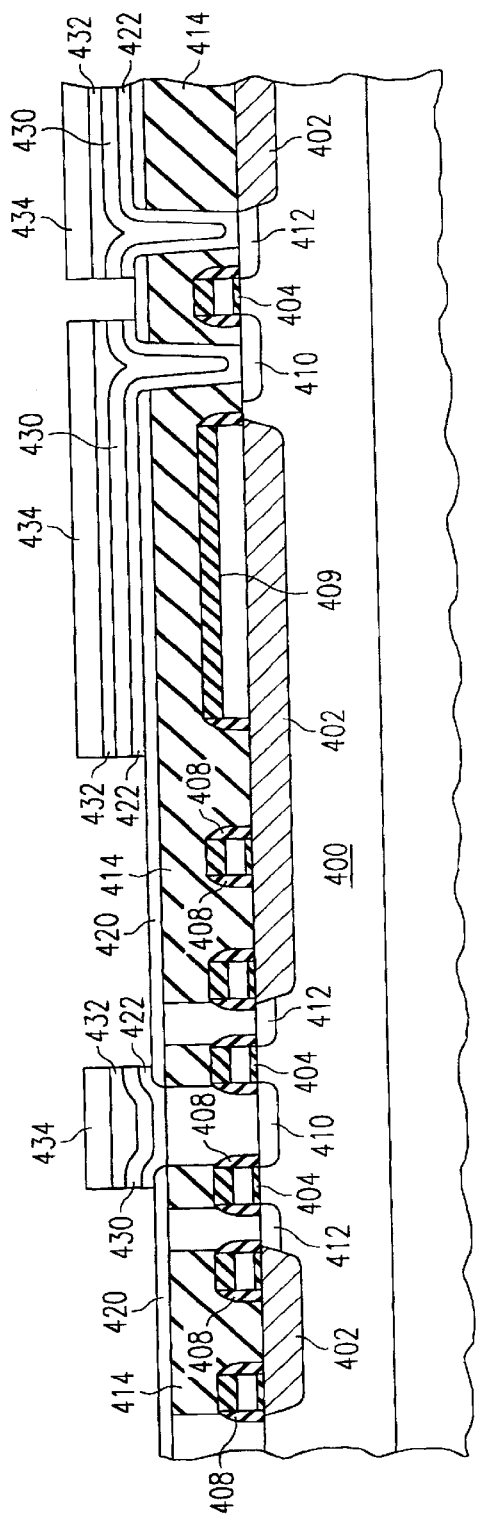
Figure 4E:
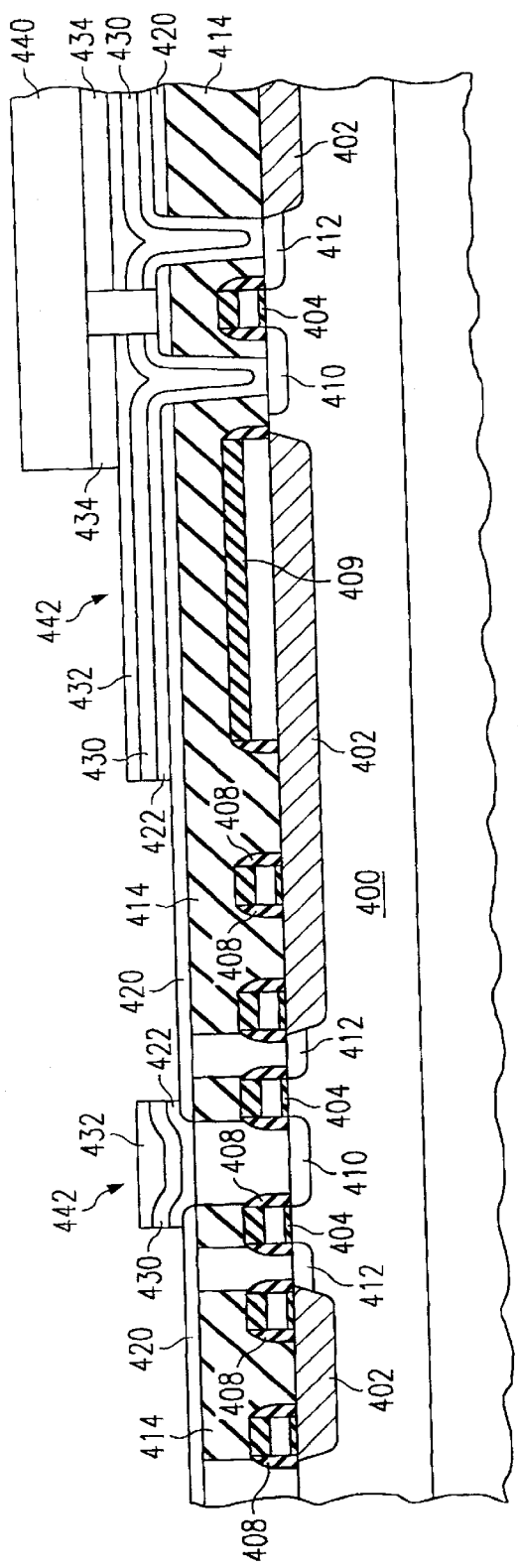

(d) Pattern photoresist (not shown) on the common-layer stack in both the cell array (to define bitlines) and in the periphery (to define interconnects). An anti-reflection coating (not shown) may be applied to layer 434 prior to patterning the photoresist. The layers 434, 432, and 430 are removed as shown in FIG. 4d. The tungsten layers are removed using reactive ion etching, for example, using a fluorinebased chemistry such as $SF_6+CO_2$, for example. If tungsten silicide layers are used instead of tungsten, a chlorine-based etch such as $Cl_2+CF_4$ is suitable. The titanium nitride etch stop layer 432 is removed using reactive ion etching, for example, using a chlorine chemistry, for example.

(e) Pattern photoresist 440 over the peripheral circuits. This patterning step does not define fine geometries and thus may be performed with a conventional binary mask. Etch the upper conductor layer 434 from the cell array to thin the bitline portions 442. See FIG. 4e.

Figure 4F:
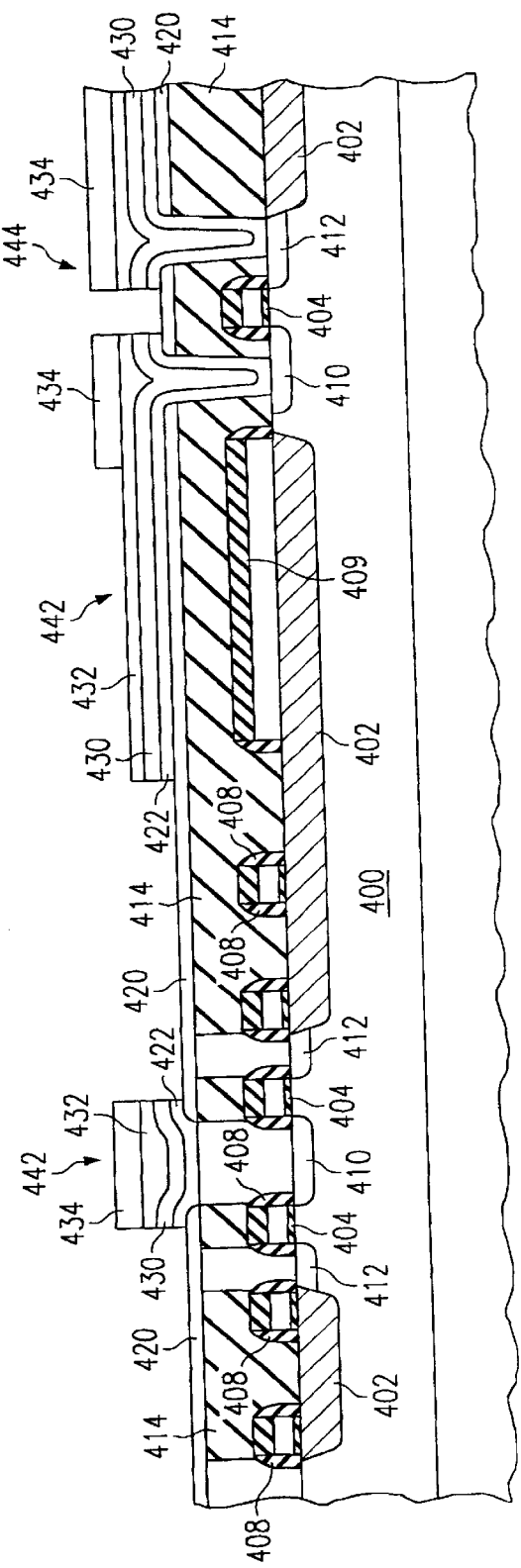

(f) Ash the photoresist 440 to leave a structure with relatively thin bitline metallization 442 (about 1 um of tungsten), and a relatively thick periphery metallization (about 4 um of tungsten) 444. The remaining process steps are conventional and result in the structure shown in FIG. 2a, where bitline 200 corresponds to element 442 in FIG. 4f and periphery interconnect 202 in the first metal layer corresponds to element 444 in FIG. 4f. The bitline and periphery interconnects are covered with interlayer dielectric 210 (oxide, nitride, or both). Storage node contacts 230 are formed through dielectric 210 to poly plugs 232. Crown capacitor bottom electrode 234 is formed from polysilicon. An area enhancement technique such as rugged poly or hemispherical grain poly may be applied to bottom electrode (storage node) 234. A capacitor dielectric 236 is deposited on the bottom electrode 234, followed by top electrode or field plate 218. Interlayer dielectrics are applied to planarize the surface of the structure. First metal layer 216 and 224 are then applied using conventional techniques.

An alternative to steps 4d, 4e, and 4f are shown in FIGS. 5a and 5b.

(dd) Rather than patterning the common-layer stack as shown in FIG. 4d, pattern the stack with photoresist 500 to expose the cell array. Thin the cell array or bitline portion of the stack as shown in FIG. 4d using the technique described above in step (e). Ash the photoresist 500.

(ee) Pattern photoresist (not shown) for the fine bitline and periphery circuit dimensions. An anti-reflection coating may be applied prior to the photoresist to help achieve fine geometries. Etch the layers 534, 532, and 522 using the technique described above in step (d). The resulting structure shown in FIG. 5b is identical to that shown in FIG. 4f.

FIGS. 6a to 6e illustrate a preferred embodiment process for fabricating a capacitor-under-bitline memory cell. Begin with the transistors formed as in the process described above. A planarized dielectric layer 600 is formed over the structure (e.g. from a TEOS precursor).

(a) Photolithographically define and etch holes (vias) in the planarized dielectric down to sources 602. Blanket deposit in situ p-doped polysilicon and etch back to form stems 604 in the holes. See FIG. 6a.

(b) Form the polysilicon bottom electrodes 610 of capacitors 612 using standard techniques. Area enhancement techniques such as rugged poly or hemispherical grain poly may be applied. Deposit capacitor dielectric layer 614 (oxide-nitride-oxide, barium strontium titanate, or tantalum pentoxide, for example), followed by titanium nitride field plate 616. See FIG. 6b.

(c) Deposit an approximately 500 nm thick interlayer dielectric 620 (e.g. PETEOS) over the structure. Etch bitline contact vias 622 to the drains 624 of the transistors. Sputter deposit a barrier layer 626 comprising, for example, titanium and titanium nitride. Perform rapid thermal annealing at approximately 700° to silicide the drain contacts.

(d) Deposit a bitline/first-metal conductor 628 such as tungsten, tungsten silicide, polysilicon, aluminum or copper, for example. The choice of material for the conductor 628 in a CUB structure is less restrictive because the conductor is formed after the high-temperature process steps used in forming the capacitors. Hence, the preferred material is a low resistivity metal such as aluminum or copper. The conductor 628 contacts drains 624 and forms the bitline and periphery interconnects. See FIG. 6c.

(e) Planarize the bitline/first-metal conductor 628 to leave approximately 1 um (if using tungsten) over the cell array portion 630 of the circuit. See FIG. 6d. Note that an etch stop layer (not shown) may be incorporated into the conductor 628 in a similar manner to that described above for FIGS. 4a to 4f.

Figure 6C:
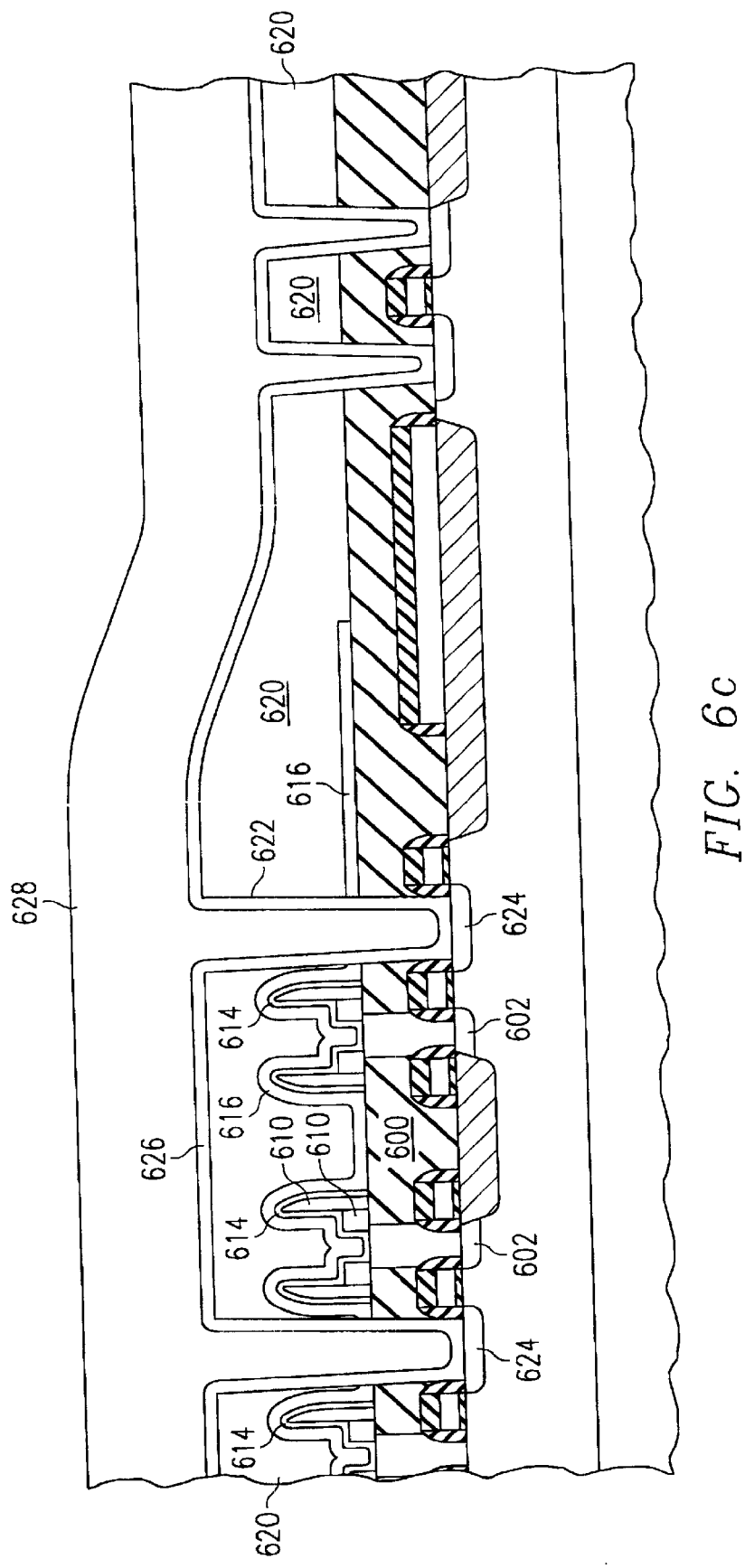
Figure 6D:
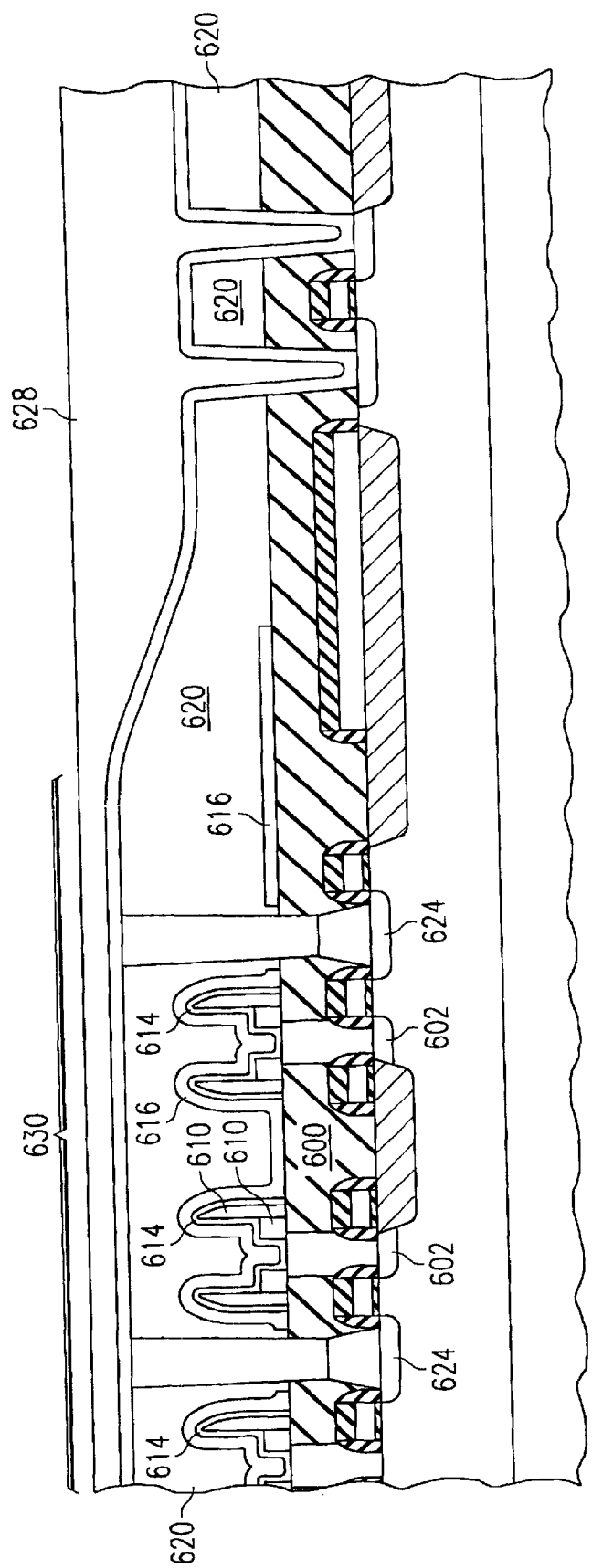
Figure 6E:
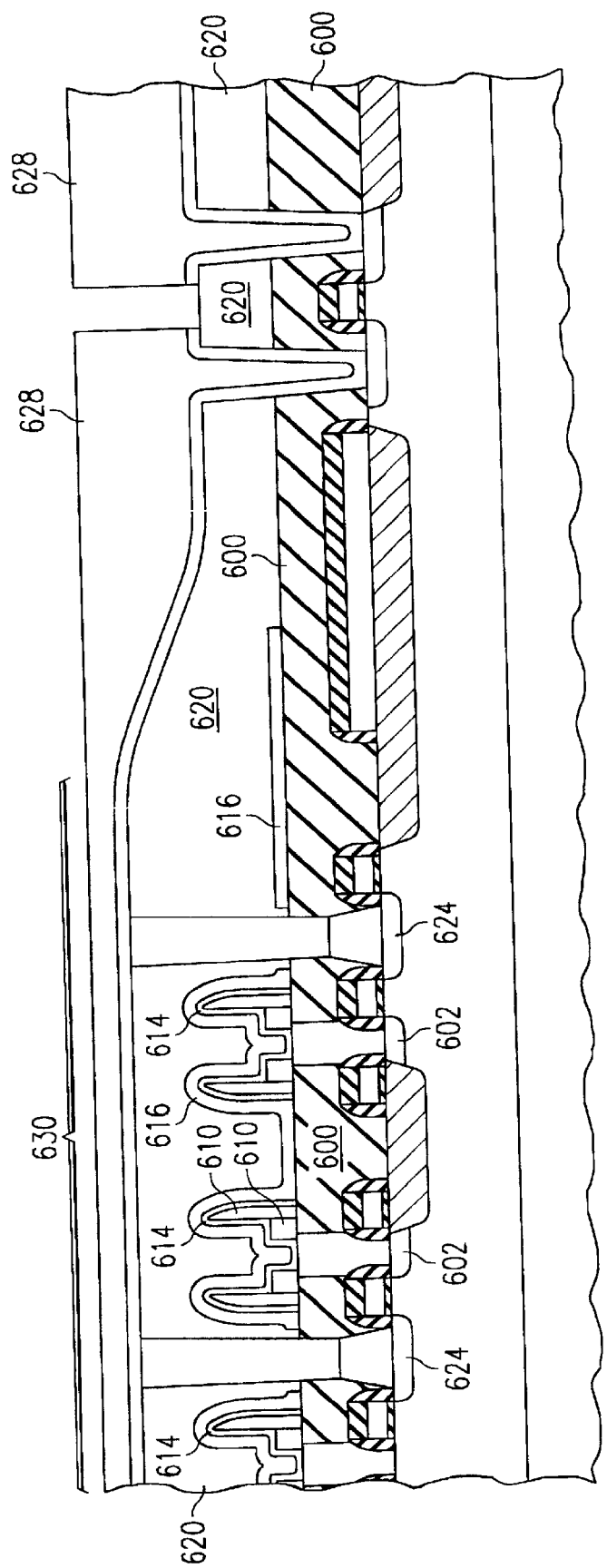

(f) Pattern and etch the bitline/first-metal layer to define bitlines over the cell array and interconnects over the periphery circuitry as shown in FIG. 6e.

The non-planarity of the surface of the structure results in a thicker layer 628 in the periphery. Upper levels of interconnects (i.e. second and third metal layers separated by interlayer dielectrics) are formed in a conventional manner.

The structure shown in FIG. 3a is formed in a similar manner, except than dielectric layer 320 is planarized, by CMP for example. The bitline portion 300 and periphery interconnect 304 portions of the bitline/first-metal layer are then formed using methods described above with reference to FIG. 4a to 4f and FIGS. 5a and 5b, for example. An etch stop layer (not shown) can be used to ensure that bitline 300 is a specified thickness following the thinning step.

Figure 7A:
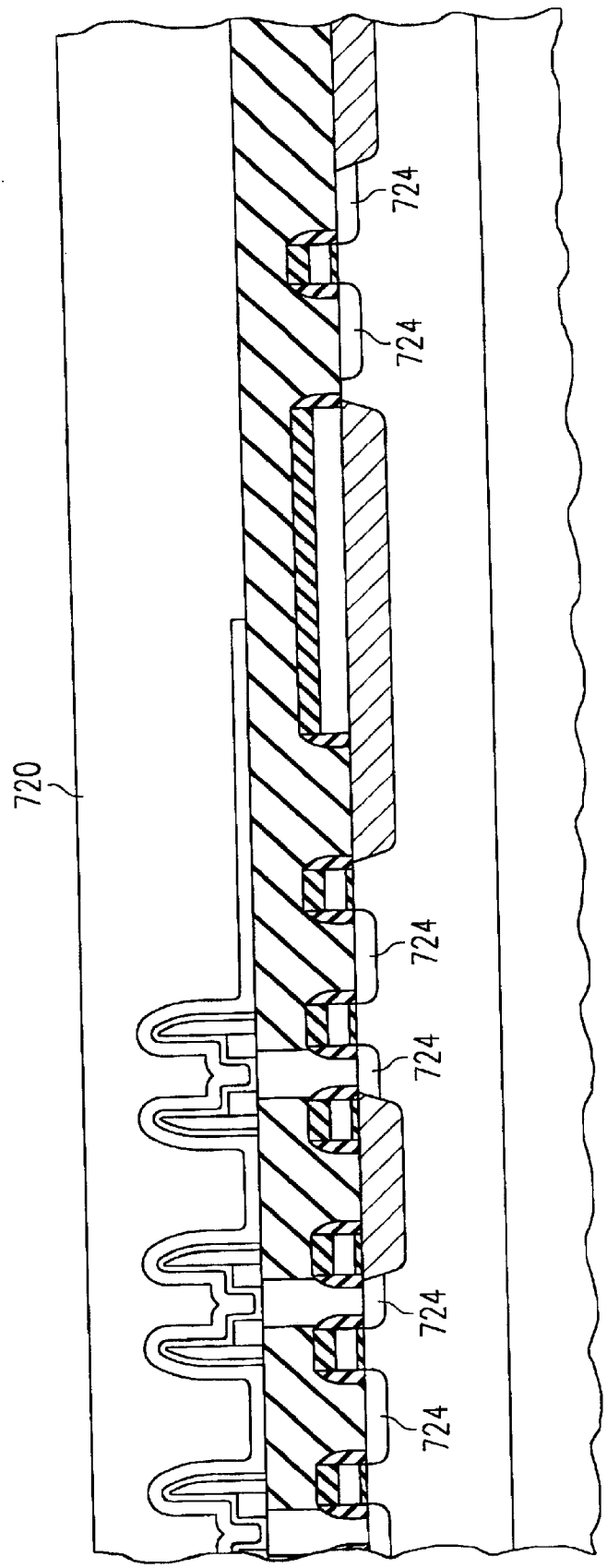
FIGS. 7a to 7c are cross-sectional diagrams of an embodiment DRAM at various stages in a fourth embodiment fabrication process in accordance with the invention.
Figure 7B:
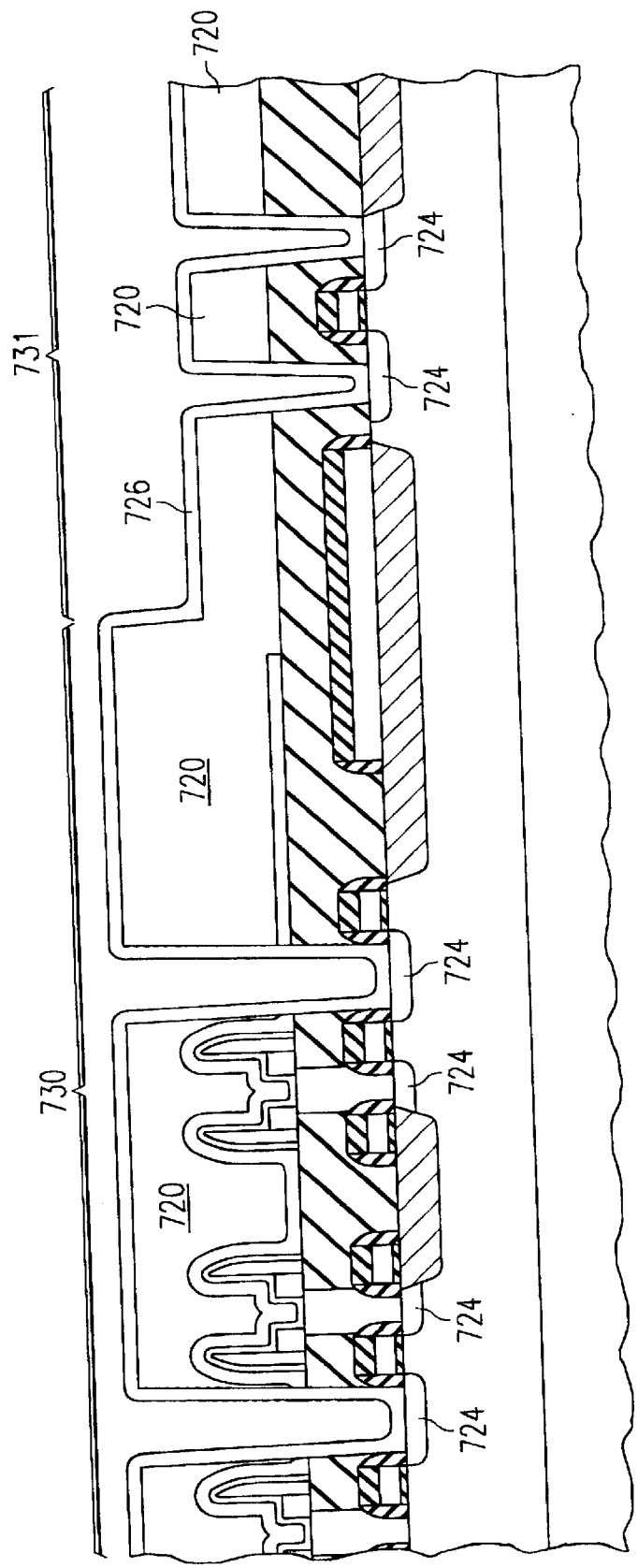
Figure 7C:
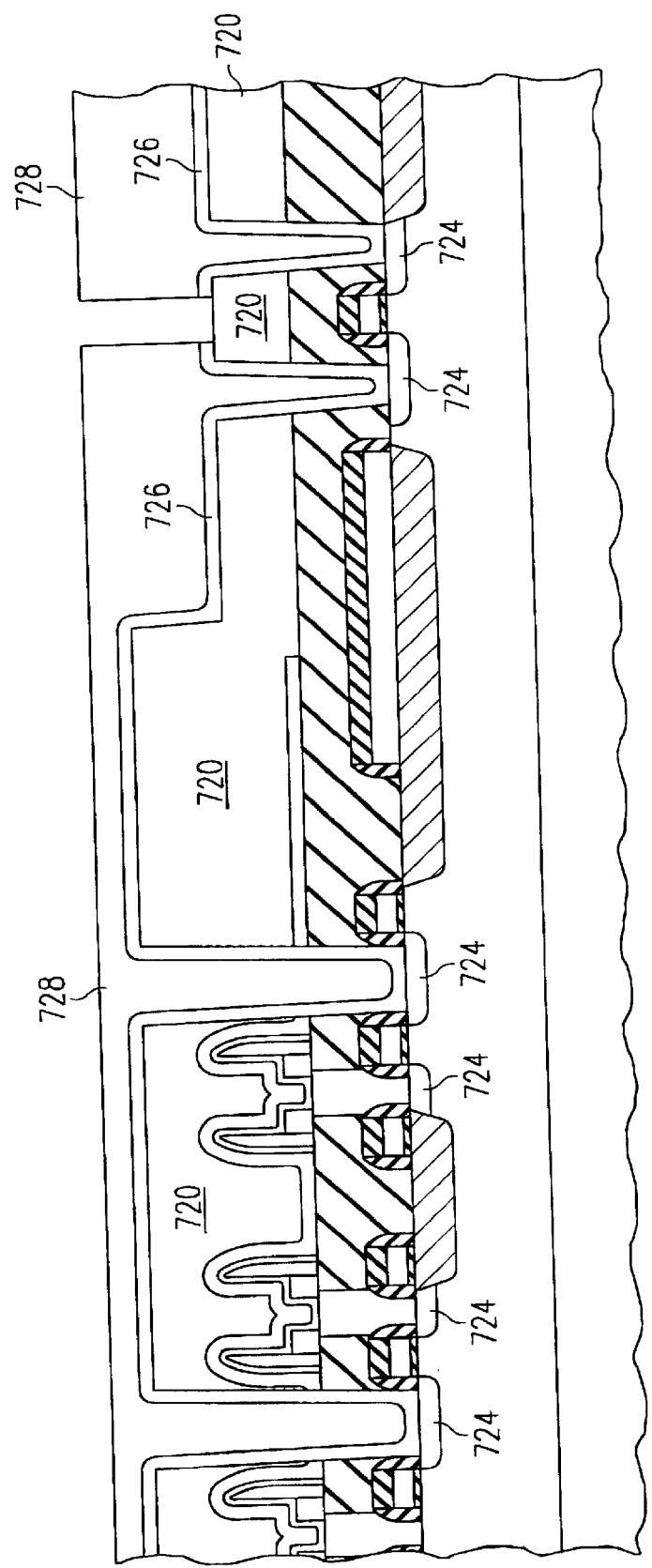

Another method of forming a CUB structure is shown in FIGS. 7a to 7c. Rather than using the existing non-planarity of the structure surface as was done in the approach shown in FIGS. 6a to 6e, the structure may first be planarized and then modified to create a height difference between the cell array and the periphery. For example, in FIG. 7a dielectric 720 planarizes the surface of the structure. This may be achieved by depositing a layer of oxide or doped glass over the structure and then planarizing with a method such as CMP. In FIG. 7b the dielectric 720 has been etched in the periphery portion of the structure 731 to create a step or height difference between the cell array and the periphery. Source and drain contact vias are etched as described above to expose the sources and drains of the array and periphery transistors. A barrier layer 726 comprising titanium and titanium nitride layers, for example, is then deposited over the structure as shown in FIG. 7b.

At least two methods may be employed in depositing the conductor layer 728 over barrier layer 726, as shown in FIG. 7c. In the first method, a low-resistivity metal such as aluminum or copper is deposited to a thickness sufficient to fill the step over the periphery 731 and the cell array. CMP, for example, may then be used to planarize the conductor layer and thin the layer covering the cell array to a thickness of approximately 1 um, for example. In a second method, the cell array can be masked with photoresist, for example, and aluminum and copper can be deposited over the periphery 731 to fill the step created with the prior removal of layer 720. The photoresist can then be removed and a second aluminum or copper deposition step performed to deposit a conductor layer over the entire structure and to the desired conductor thickness over the cell array 730. The conductor layer can then be patterned for form bitlines over the cell array and interconnects over the periphery circuits as shown in FIG. 7c.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiment memory circuits described herein could be embedded on an integrated circuit with a processor such as a microprocessor or digital signal processor. It is therefore intended that the appended claims encompass any such modifications or embodiments.

What is claimed is:

1. An integrated circuit, comprising:

a memory cell array;

circuits peripheral to said array;

a conductor coupling said array to said peripheral circuits, said conductor having a first horizontal portion with a first thickness in said array and a second horizontal portion with a second thickness in said peripheral circuits wherein said second thickness differs from said first thickness;

wherein said conductor comprises tungsten silicide.

2. An integrated circuit, comprising:

a memory cell array including wordlines formed on a substrate and bitlines and capacitors formed over said wordlines, said bitlines having a first thickness horizontally and pitch; and circuits peripheral to said array including transistors formed in said substrate and conductors over said transistors, said conductors having a second thickness horizontally and pitch;

wherein said bitlines and conductors are formed in a common conductive layer and said first thickness and said second thickness differ;

wherein said bitlines and conductors comprises tungsten silicide.

* * * * *